(12) United States Patent
Kim et al.

(10) Patent No.: US 12,471,321 B2
(45) Date of Patent: Nov. 11, 2025

(54) OXIDE THIN FILM TRANSISTOR INCLUDING PHOTOCATALYST LAYER AND METHOD FOR MANUFACTURING THE SAME

(71) Applicant: UIF (University Industry Foundation), Yonsei University, Seoul (KR)

(72) Inventors: Hyun Jae Kim, Seoul (KR); Jong Bin An, Seoul (KR); Sujin Jung, Seoul (KR); Kunho Moon, Goyang-si (KR); Jong Hyuk Ahn, Seoul (KR); I Sak Lee, Paju-si (KR); Dong Hyun Choi, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 396 days.

(21) Appl. No.: 18/107,020

(22) Filed: Feb. 8, 2023

(65) Prior Publication Data

US 2023/0253505 A1 Aug. 10, 2023

(51) Int. Cl.
*H10D 30/67* (2025.01)
*H10D 30/01* (2025.01)

(52) U.S. Cl.
CPC ....... *H10D 30/6755* (2025.01); *H10D 30/031* (2025.01); *H10D 30/6729* (2025.01); *H10D 30/673* (2025.01)

(58) Field of Classification Search
CPC ............ H10D 30/675; H10D 30/6741; H10D 30/6755; H10D 30/6756;
(Continued)

(56) References Cited

U.S. PATENT DOCUMENTS

| 8,247,276 B2 * | 8/2012 | Kondo | H10D 86/60 438/164 |
| 2013/0037807 A1 * | 2/2013 | Fukaya | H10D 86/423 438/151 |

(Continued)

FOREIGN PATENT DOCUMENTS

| JP | 2012-089857 A | 5/2012 |
| KR | 10-2006-0124630 A | 12/2006 |

(Continued)

OTHER PUBLICATIONS

Young Jun Tak, et al., "Boosting Visible Light Absorption of Metal-Oxide-Based Phototransistors via Heterogeneous In—Ga—Zn—O and CH3NH3PbI3 Films", ACS Applied Materials & Interfaces Oct. 2018, pp. 12854-12861.

(Continued)

*Primary Examiner* — Natalia A Gondarenko
(74) *Attorney, Agent, or Firm* — Park, Kim & Suh, LLC

(57) ABSTRACT

Disclosed is a method for manufacturing an oxide thin film transistor including forming a gate electrode on a substrate, forming an oxide semiconductor thin film provided on the substrate to be insulated from the gate electrode by using a first mask, forming an electrode on the oxide semiconductor thin film by using the first mask, applying an oxidizer in one area of the electrode, and annealing the electrode, on which the oxidizer is applied.

13 Claims, 12 Drawing Sheets

(58) Field of Classification Search
CPC ... H10D 30/031–0327; H10D 30/6729; H10D 30/673; H10D 30/6732; H10D 30/6734; H10D 99/00; H10D 86/021–0251; H10F 77/12–1285; H10F 77/244–254; H10F 77/413; H10F 71/00–1395; H10F 30/289; H10K 10/46–491; H01L 21/0223; H01L 21/02244; H01L 21/02252; H01L 21/02255; H01L 21/02258
USPC ............ 257/288, 43, 57, 21.411, 29.003; 438/151, 158, 164
See application file for complete search history.

(56) References Cited

U.S. PATENT DOCUMENTS

2014/0361287 A1\* 12/2014 Shieh ............... H10D 30/6723
257/43
2016/0343863 A1\* 11/2016 Chi ...................... H10D 99/00

FOREIGN PATENT DOCUMENTS

| KR | 10-2008-0088341 A | 10/2008 |
| KR | 10-2018-0020916 A | 2/2018 |
| KR | 10-2018-0110598 A | 10/2018 |
| KR | 10-2019-0053497 A | 5/2019 |
| KR | 10-2019-0059636 A | 5/2019 |

OTHER PUBLICATIONS

Hyukjoon Yoo, et al., "High Photosensitive Indium-Gallium-Zinc Oxide Thin-Film Phototransistor with a Selenium Capping Layer for Visible-Light Detection", ACS Applied Materials & Interfaces Dec. 2020, pp. 10673-10680.

Won-Gi Kim, et al., "Photo-induced Reactive Oxygen Species Activation for Amorphous Indium-Gallium-Zinc Oxide Thin-Film Transistors Using Sodium Hypochlorite", ACS Applied Materials & Interfaces 2021, 13, pp. 44531-44540.

\* cited by examiner

FIG. 6C

| | | IGZO phototransistor w/o Photocatalytic layer | IGZO phototransistor w/ Photocatalytic layer |
|---|---|---|---|
| Red light (635 nm, 5mW/m m$^2$) | Photosensitivity | $2.30 \times 10^0$ | $1.62 \times 10^3$ |
| | Detectivity (Jones) | $8.92 \times 10^6$ | $6.75 \times 10^7$ |
| Green light (532 nm, 5mW/m m$^2$) | Photosensitivity | $3.48 \times 10^1$ | $3.60 \times 10^3$ |
| | Detectivity (Jones) | $2.42 \times 10^7$ | $1.50 \times 10^8$ |

OXIDE THIN FILM TRANSISTOR INCLUDING PHOTOCATALYST LAYER AND METHOD FOR MANUFACTURING THE SAME

STATEMENT REGARDING GOVERNMENT SPONSORED RESEARCH OR DEVELOPMENT

The present invention is derived from research conducted as part of project (Project Identification No.: 1415177855, Project No.: 20017208, Research period: 2021.07.01.~ 2022.03.31). Meanwhile, there is no property interest of the Korean government in any aspect of this invention.

CROSS-REFERENCE TO RELATED APPLICATIONS

This application claims priority under 35 U.S.C. § 119 to Korean Patent Application No. 10-2022-0016566 filed on Feb. 9, 2022, in the Korean Intellectual Property Office, the disclosures of which are incorporated by reference herein in their entireties.

BACKGROUND

Embodiments of the present disclosure described herein relate to an oxide thin film transistor including a photocatalyst layer, and more particularly, relate to an oxide thin film transistor that may sense a visual ray by using a photocatalyst layer generated through deposition and annealing using a sputtering process.

A conventional oxide based thin film transistor cannot absorb a visual ray due to a wide band gap, and thus is limited to an application of a visual ray phototransistor. To solve this, the conventional oxide based phototransistor use perovskite, selenium, or the like as an absorption layer. However, the conventional method has problems such as difficulty in synthesizing materials, environmental vulnerability in which an additional absorption layer may be deformed by external water and oxygen, the need for masks of various patterns, and the complexity of the process due to the use of complex and expensive equipment. Accordingly, there is a need for a manufacturing method capable of realizing the convenience of and reducing costs for manufacturing a transistor.

SUMMARY

Embodiments of the present disclosure relate to a method for forming a photocatalyst layer for sensing a visual ray in a transistor.

According to an embodiment, a method for manufacturing an oxide thin film transistor includes forming a gate electrode on a substrate, forming an oxide semiconductor thin film provided on the substrate to be insulated from the gate electrode by using a first mask, forming an electrode on the oxide semiconductor thin film by using the first mask, applying an oxidizer in one area of the electrode, and annealing the electrode, on which the oxidizer is applied.

Here, the annealed one area is a photocatalyst layer for moving electrons of the oxide semiconductor thin film.

Here, the electrode may include a first electrode and a second electrode divided by the photocatalyst layer, and the first electrode may be a source electrode and the second electrode may be a drain electrode.

Here, the photocatalyst layer may have positive charges.

Here, the annealing may be performed at 300 degrees.

Here, the annealing may be performed for 10 minutes.

Here, the oxide semiconductor thin film may include at least one of indium gallium zinc oxide (IGZO), zinc oxide (ZnO), indium zinc oxide (IZO), indium tin oxide (ITO), zinc tin oxide (ZTO), silicon indium zinc oxide (SIZO), gallium zinc oxide (GZO), hafnium indium zinc oxide (HIZO), zinc indium tin oxide (ZITO), and aluminum zinc tin oxide (AZTO).

Here, the photocatalyst layer may include at least one of titanium dioxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$).

Here, the photocatalyst layer may generate off-currents.

According to an embodiment, an oxide thin film transistor includes a gate electrode formed on a substrate, an oxide semiconductor thin film provided on the substrate to be insulated from the gate electrode by using a first mask, an electrode formed on the oxide semiconductor thin film by using the first mask, and a photocatalyst layer formed in one area of the electrode, the electrode includes a source electrode and a drain electrode divided by the photocalayst layer, and the photocatalyst layer is formed by annealing one area of the electrode, to which an oxidizer is applied.

BRIEF DESCRIPTION OF THE FIGURES

The above and other objects and features of the present disclosure will become apparent by describing in detail embodiments thereof with reference to the accompanying drawings.

FIGS. 6A to 6C are views illustrating a performance of an oxide thin film transistor including a photocatalyst layer.

DETAILED DESCRIPTION

Figure 1A:
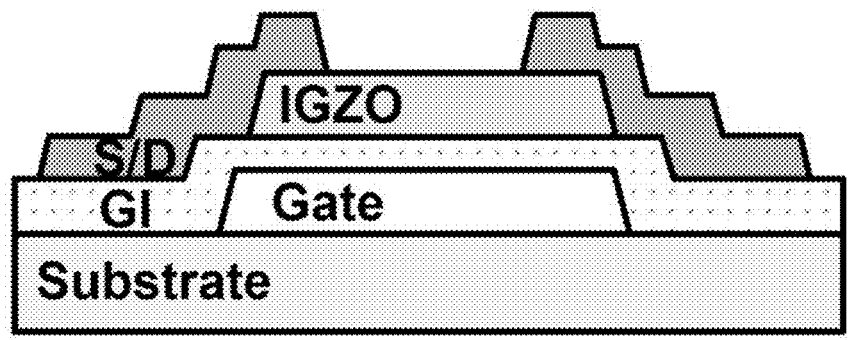
FIGS. 1A and 1B are views illustrating a conventional oxide thin film transistor and an energy band gap.

Embodiments described in the specification is for clearly explaining the spirit of the present disclosure to an ordinary person in the art, to which the present disclosure pertains, and it should be construed that the present disclosure is not limited to the embodiments disclosed in the specification and the scope of the present disclosure include corrections or modifications that do not deviate from the spirit of the present disclosure.

For the terms used in the specification, general terms that are being used as currently widely as possible in consideration of the functions in the present disclosure, but this may be changed according to an intention of an ordinary person in the art to which the present disclosure pertains, a precedent, or advent of a new technology. However, unlike this, the meanings of a specific term will be separately described when the term is defined as an arbitrary meaning to be used. Accordingly, the terms used in the specification should be construed based on not simple titles of the terms but substantial meanings of the terms and the contents over the specification.

The drawings attached to the specification are for easily explaining the present disclosure, and the shapes illustrated in the drawings may be exaggerated according to necessities to help understanding of the present disclosure, and thus the present disclosure is not limited by the drawings.

In the specification, when a detailed description of known configurations or functions related to the present disclosure may make the essence of the present disclosure unclear, a detailed description thereof will be omitted according to necessities.

Figure 1B:
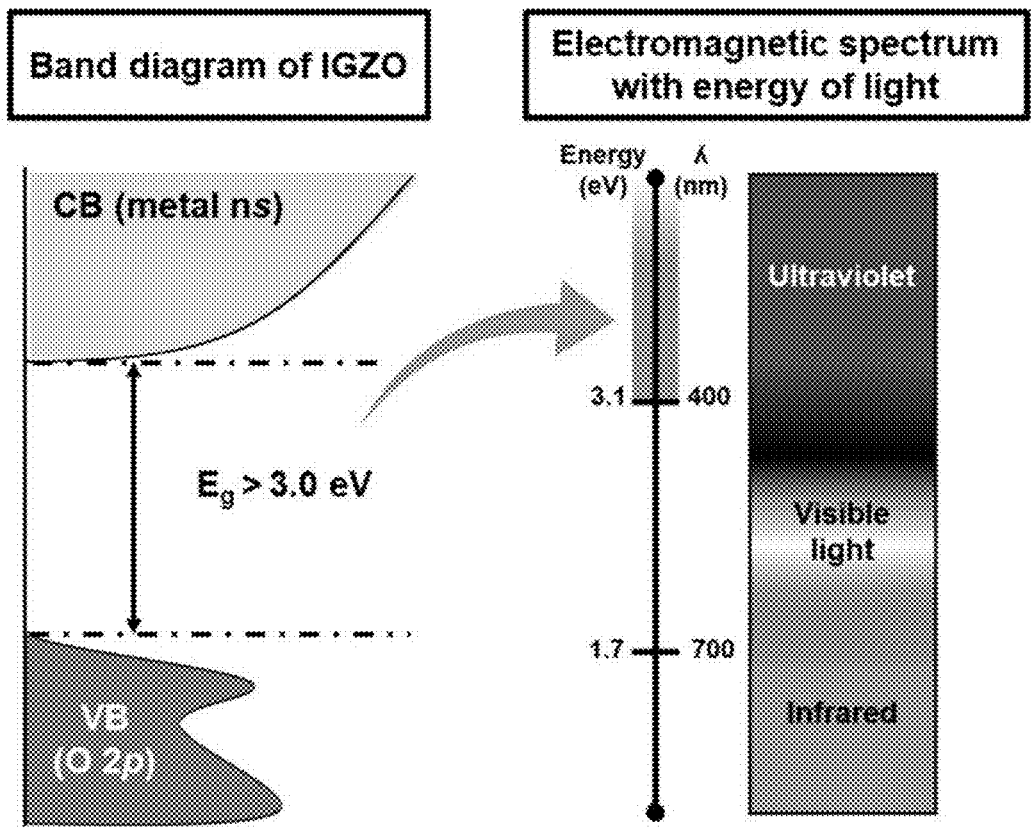

FIGS. 1A and 1B are views illustrating a conventional oxide thin film transistor and an energy band gap.

FIG. 1A is a view illustrating a cross-section of a conventional oxide thin film transistor, and FIG. 1B is a view illustrating an energy band gap of an oxide semiconductor thin film including indium gallium zinc oxide, and a wavelength that may be sensed accordingly.

Referring to FIG. 1A, in the conventional oxide thin film transistor, a metal electrode deposited on an oxide semiconductor thin film (e.g., indium gallium zinc oxide (IGZO)) may be located. When light is input to the oxide semiconductor thin film between the electrodes, electrons of a balance band (VB) may go over to a conduction band (CB) while overcoming a band gap.

As illustrated in FIG. 1B, a balance band of the oxide semiconductor thin film including indium gallium zinc oxide and an energy gap between conduction bands may be 3.0 eV or more. Accordingly, light input to the oxide semiconductor thin film may be sensed by the oxide thin film transistor only when the light has energy of 3.0 eV or more.

Referring to a light spectrum of FIG. 1B, a general visual ray may have a wavelength in a range of about 400 nm to 700 nm, and thus may have energy of 3.1 eV to 1.7 eV. Accordingly, the oxide semiconductor thin film including indium gallium zinc oxide widely used for transistors in the industry may not be suitable for sensing a visual ray.

To solve this, conventionally, perovskite, selenium, and the like are used as an absorption layer to absorb a visual ray. In detail, a perovskite material has a small band gap, and thus may be advantageous for absorbing a visual ray. However, it is difficult to synthesize the material, and the material is vulnerable to an external environment (oxygen, water, and the like) to be easily deformed and has another problem of causing a defect.

Furthermore, in detail, selenium is an inorganic material having a small band gap, and an oxide thin film transistor that takes it as an absorption layer is present. However, the selenium material has toxicity, and it is difficult to use it in the industry. Furthermore, a selenium absorption layer has to be deposited on an electrode, and an etching selection ratio of selenium with respect to a material used as the electrode is low and complex expensive equipment in addition to a sputter is necessary to deposit the selenium absorption layer.

Accordingly, the present disclosure suggests an oxide thin film transistor including a photocatalyst layer, which may absorb a visual ray by oxidizing the same material as the electrode without adding a separate material.

Unlike the conventional technology that uses a separate material as an absorption layer, a separate material is not added to the oxide thin film transistor of the present disclosure, and thus a manufacturing method thereof is not complex and it is not necessary to consider a vulnerability to an external environment.

Furthermore, because the number of masks by depositing the electrode while reusing the masks used when an existing oxide semiconductor thin film is deposited, a price competitiveness may be secured through reduction of costs.

The oxide thin film transistor and a method for manufacturing the same according to the present disclosure may be directly applied to the industry without having to maintain and repair additional equipment by using a material (tungsten, IGZO, or the like) and equipment (a sputter, printing equipment, or the like) used in the existing industry.

Furthermore, according to the present disclosure, because electrons of the oxide semiconductor thin film (e.g., IGZO) may travel through the photocatalyst layer, a problem of not being able to sense a visual ray with a wide band gap may be solved. Detailed contents thereof will be described later.

Figure 2:
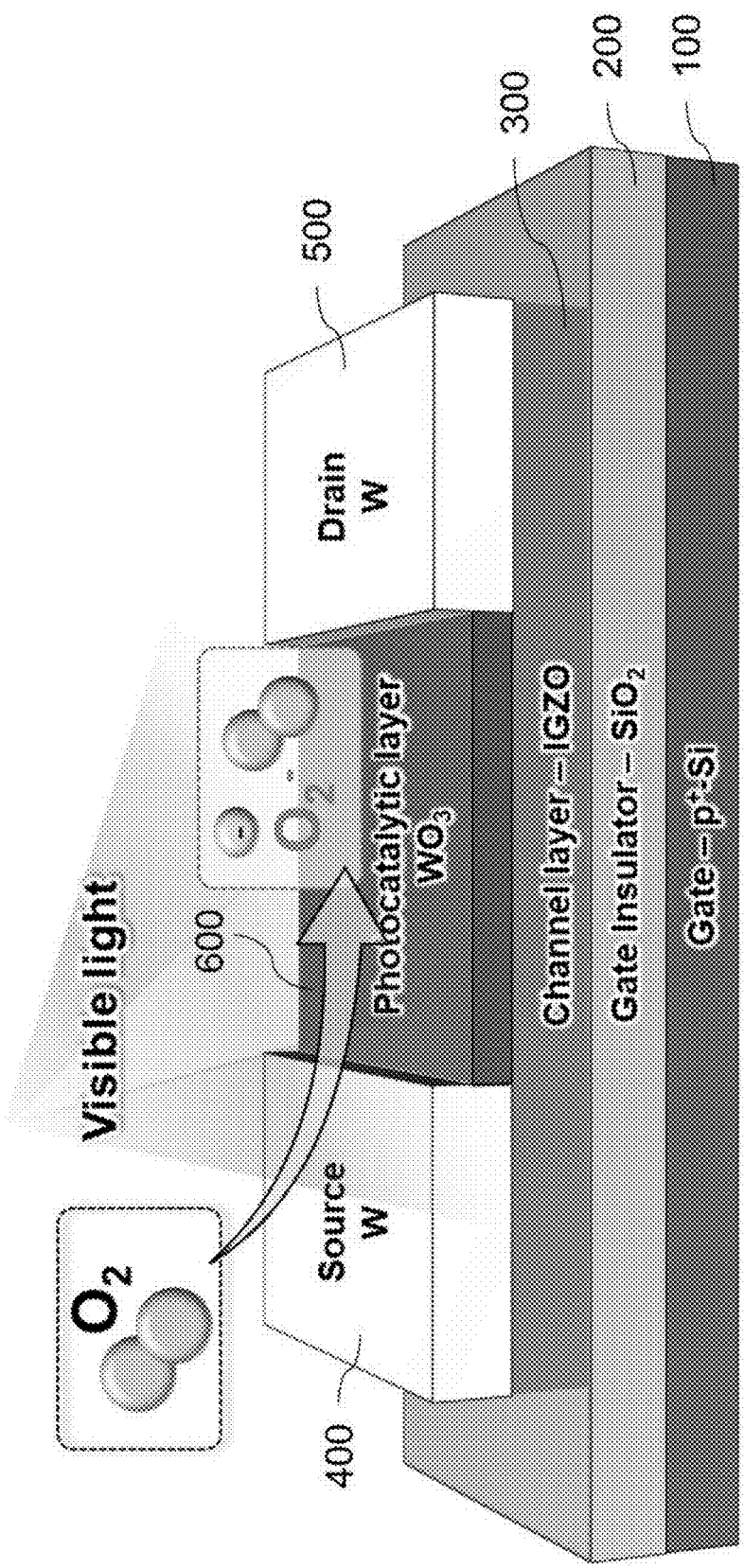
FIG. 2 is a view illustrating an oxide thin film transistor including a photocatalyst layer according to an embodiment.

FIG. 2 is a view illustrating the oxide thin film transistor including the photocatalyst layer according to an embodiment.

Referring to FIG. 2, the oxide thin film transistor may include a substrate (not illustrated), a gate electrode 100, an insulating layer 200, an oxide semiconductor thin film 300, a source electrode 400, a drain electrode 500, and a photocatalyst layer 600.

The substrate is a base of the oxide thin film transistor, and may function to support various components. For example, the substrate may include any one material selected from the group consisting of glass, polyimide-based polymers, polyester-based polymers, silicone-based polymers, acrylic-based polymers, polyolefin-based polymers, or copolymers thereof.

In detail, the substrate may include at least one of polyester, polyvinyl, polycarbonate, polyethylene, polyacetate, polyimide, polyethersulfone, polyacrylate, polyethylenenaphthalate, and polyethyleneetherphthalate.

The gate electrode 100 may be formed on the substrate. In detail, the gate electrode 100 may be formed on the substrate by using at least one method of a vacuum deposition method, a chemical vapor deposition method, a physical vapor deposition method, an atomic layer deposition method, an organic metal chemical vapor deposition method, a plasma chemical deposition method, a molecular beam growth method, a hydride vapor deposition method, sputtering, spin coating, deep coating, and zone casting, but the present disclosure is not limited thereto.

The gate electrode 100 may be formed of any one of molybdenum (Mo), aluminum (Al), chromium (Cr), gold (Au), titanium (Ti), nickel (Ni), neodymium (Nd) and copper (Cu) or a combination thereof, but the present disclosure is not limited thereto. FIG. 2 illustrates that the gate electrode 100 includes a p+-Si material, but the present disclosure is not limited thereto.

The insulating layer 200 may be formed on the gate electrode 100. The insulating layer 200 may interrupt electrical connections of the gate electrode 100 and other metal layers. In detail, the insulating layer 200 may function to interrupt an electrical connection of the gate electrode 100 and the oxide semiconductor thin film 300.

The insulating layer 200 may be formed by using at least one method of a vacuum deposition method, a chemical vapor deposition method, a physical vapor deposition method, an atomic layer deposition method, an organic metal chemical vapor deposition method, a plasma chemical deposition method, a molecular beam growth method, a hydride vapor deposition method, sputtering, spin coating, deep coating, and zone casting, but the present disclosure is not limited thereto. Preferably, to avoid complexity of processes, the same method as the method of forming the gate electrode 100 may be used.

The insulating layer 200 may be formed of an inorganic material, such as silicon oxide ($SiO_x$), silicon nitride ($SiN_x$), titanium oxide ($TiO_x$), or hafnium oxide ($HfO_x$), or an organic material, such as polyvinyl alcohol (PVA), polyvinylpyrrolidone (PVP), or polymethyl methacrylate (PMMA), but the present disclosure is not limited thereto. FIG. 2 illustrates that the insulating layer 200 is silicon oxide ($SiO_2$), but the present disclosure is not limited thereto.

The oxide semiconductor thin film 300 may be formed on the insulating layer 200. The oxide semiconductor thin film 300 may be deposited through a sputtering process by using a first mask on the insulating layer 200. Then, the first mask is a shadow mask, and the oxide semiconductor thin film 300 may be deposited on the insulating layer 200 through a shadow effect.

The oxide semiconductor thin film 300 may be annealed for activation thereof after being deposited on the insulating layer 200. That is, after the deposition, the oxide semiconductor thin film 300 may be electrically activated through heat treatment.

Electrodes 400 and 500 may be formed on the semiconductor thin film 300. FIG. 2 illustrates that the source electrode 400 and the drain electrode 500 is separated from each other while a photocatalyst layer 600 being interposed therebetween, but the source electrode 400 and the drain electrode 500 are simultaneously formed of one metal material time-sequentially before the photocatalyst layer 600 is formed.

The electrodes 400 and 500 may be deposited on the oxide semiconductor thin film 300 through a sputtering process by using a second mask. Then, the second mask may be the first mask that is used when the oxide semiconductor thin film 300 is deposited. That is, according to the method for manufacturing the oxide thin film transistor according to the present disclosure, the mask used when the oxide semiconductor thin film 300 is manufactured also may be recycled when the electrodes 400 and 500 are deposited.

Conventionally, the source electrode and the drain electrode are formed by using a source-drain mask instead of a mask that is used when the oxide semiconductor thin film 300 is generated. That is, because an electrode having a shape that is different from that of the oxide semiconductor thin film 300 has to be formed, the number of necessary masks is larger and thus costs are high. However, according to the manufacturing method according to the present disclosure, manufacturing costs may be reduced because the number of the necessary masks may be reduced by reusing the masks.

Because the electrodes 400 and 500 are deposited by using the first mask, the deposited electrodes 400 and 500 may have the same shapes and/or sizes as that of the oxide semiconductor thin film 300. However, the present disclosure is not limited thereto, and sizes of the oxide semiconductor thin film 300 and the electrodes 400 and 500 may be made different by adjusting a condition (time, temperature, or the like) of a sputtering process.

The electrodes 400 and 500 are metal materials, and may include aluminum (Al), aluminum alloy, tungsten (W), copper (Cu), nickel (Ni), chromium (Cr), molybdenum (Mo), titanium (Ti), platinum (Pt), tantalum (Ta), or a mixture thereof, but the present disclosure is not limited thereto. FIG. 2 illustrates that the electrodes 400 and 500 are formed of tungsten, but the present disclosure is not limited thereto.

The photocatalyst layer 600 may be formed by oxidizing one area of the electrodes 400 and 500. In detail, the photocatalyst layer 600 may be formed by applying an oxidizer to areas of the deposited electrodes 400 and 500 by using printing equipment and annealing it. Then, the printing equipment is EHD-jet (E-jet) printing equipment, and may be more inexpensive than conventional other equipment. Furthermore, the oxidizer may be hydrogen peroxide ($H_2O_2$), but the present disclosure is not limited thereto.

The annealing process for generating the photocatalyst layer 600 may be performed under a specific condition. The annealing process may be performed at 300 degrees. Furthermore, the annealing process may be performed for 10 minutes. The condition (for 10 minutes at 300 degrees) of the annealing process corresponds to values that are discovered through experiments, and detailed contents will be described with reference to FIGS. 5A to 5C.

Through the annealing process, portions of the electrodes 400 and 500 may be oxidized to function as a photocatalyst. For example, when the electrodes 400 and 500 are formed of tungsten, areas of the electrodes 400 and 500 may be oxidized and thus the areas (the photocatalyst layer 600) may become tungsten trioxide ($WO_3$).

The photocatalyst layer 600 may be oxidized to deliver electrons to oxygen in the air, and thus the photocatalyst layer 600 may have positive charges. Because the photocatalyst layer 600 has positive charges, the photocatalyst layer 600 may obtain electrons from the oxide semiconductor thin film 300 that is an adjacent metal layer. That is, the electrons travel from the oxide semiconductor thin film 300 to the photocatalyst layer 600.

Due to the travel of the electrons due to the photocatalyst layer 600, currents may be generated in an off area, in which no voltage is applied to the transistor. That is, off-currents may be generated in the oxide thin film transistor including the photocatalyst layer 600.

Furthermore, because of the travel of the electrons due to the photocatalyst layer 600, the oxide thin film transistor including the photocatalyst layer may sense a visual ray even when the oxide semiconductor thin film 300 having a large gap is used. A result of sensing of the visual ray by the transistor according to the present disclosure will be described in detail with reference to FIGS. 6A to 6C.

Figure 3A:
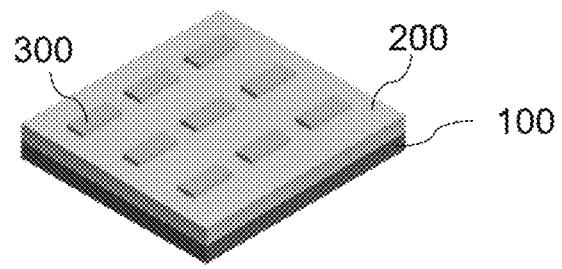
FIGS. 3A to 3C are views illustrating a method for manufacturing an oxide thin film transistor including a photocatalyst layer according to an embodiment.
Figure 3B:
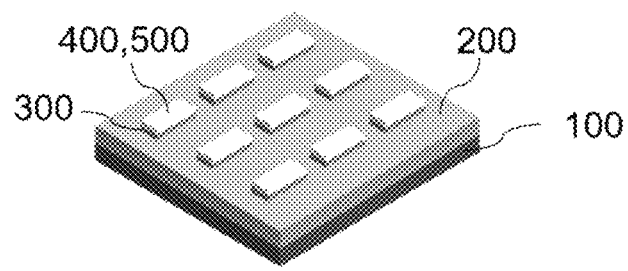
Figure 3C:
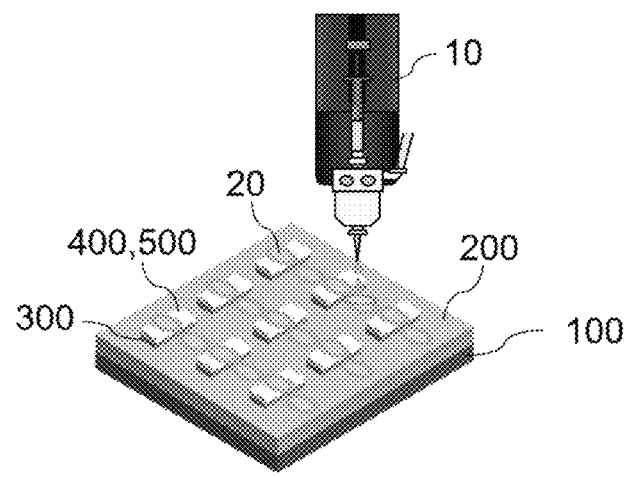

FIGS. 3A to 3C are views illustrating a method for manufacturing an oxide thin film transistor including the photocatalyst layer according to an embodiment.

FIG. 3A is a view illustrating a process of depositing the oxide semiconductor thin film, FIG. 3B is a view illustrating a process of depositing the electrodes, and FIG. 3C is a view illustrating a process of forming the photocatalyst layer.

Referring to FIG. 3A, it may be seen that the insulating layer 200 is formed on the gate electrode 100. The oxide semiconductor thin film 300 may be deposited on the insulating layer 200 through a sputtering process by using a shadow mask. As illustrated in FIG. 3A, the oxide semiconductor thin film 300 may be deposited on one area of the insulating layer 200. The area, in which the oxide semiconductor thin film 300 is deposited, may be changed according to a pattern of the mask.

Referring to FIG. 3B, it may be seen that the electrodes 400 and 500 are deposited on the oxide semiconductor thin film 300. Because the masks used to deposit the electrodes 400 and 500 are the same as the masks used when the oxide semiconductor thin film 300, the shapes of the oxide semiconductor thin film 300 and the electrodes 400 and 500 may be the same. That is, the electrodes 400 and 500 may be deposited on an entire surface of the oxide semiconductor thin film 300 instead on one area thereof.

Referring to FIG. 3C, it may be seen that the oxidizer 20 is applied to areas of the electrodes 400 and 500 by printing equipment 10. The areas, to which the printing equipment 10 applies the oxidizer 20, may be changed according to various conditions, but the electrodes 400 and 500 have to be separated to two areas by the areas, to which the oxidizer 20 is applied. That is, the source electrode 400 and the drain electrode 500 may be separated from each other by the areas (that is, the photocatalyst layer), to which the oxidizer 20 is applied.

An annealing process may be formed on the areas of the electrodes 400 and 500, to which the oxidizer 20 is applied, according to a specific condition. For example, the annealing process of performing heat treatment for 10 minutes at 300 degrees may be performed on the one area. The areas of the electrodes 400 and 500 are oxidized through the annealing process, and the oxidized area may become the photocatalyst layer 600, through which the electrons of the oxide semiconductor thin film 300 travel.

Figure 4:
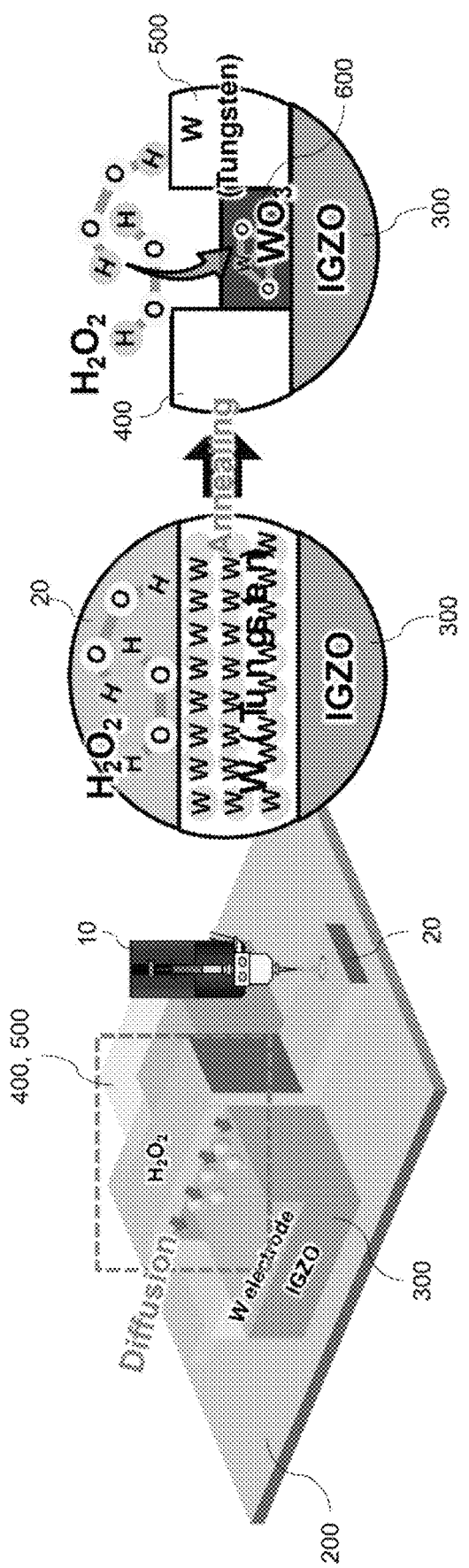
FIG. 4 is a view illustrating a process of annealing an electrode, on which an oxidizer is applied.

FIG. 4 is a view illustrating a process of annealing an electrode, on which the oxidizer is applied. FIG. 4 is a view illustrating a process of FIG. 3C in detail.

Referring to FIG. 4, it may be seen that the oxidizer 20 applied by the printing equipment 10 causes an oxidization process through the annealing.

When the oxidizer 20 is applied to the areas of the electrodes 400 and 500 deposited on the oxide semiconductor thin film 300 and then the annealing process is performed, the areas of the electrodes 400 and 400 may be oxidized to become the photocatalyst layer 600. The electrodes 400 and 500 are divided by the photocatalyst layer 600 such that one of them may become the source electrode 400 and the remaining one may become the drain electrode 500.

Figure 5A:
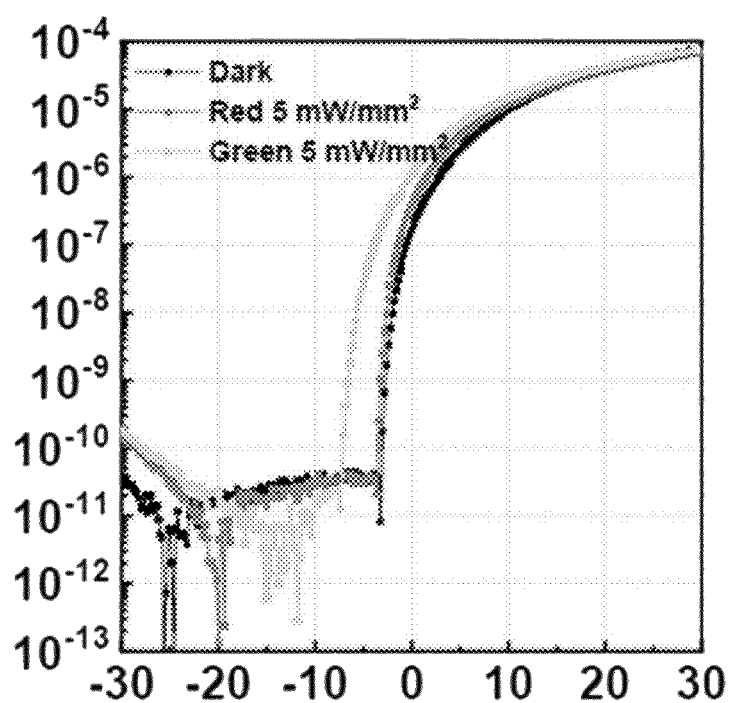
FIGS. 5A to 5C are views illustrating an annealing condition for generating a photocatalyst layer.
Figure 5B:
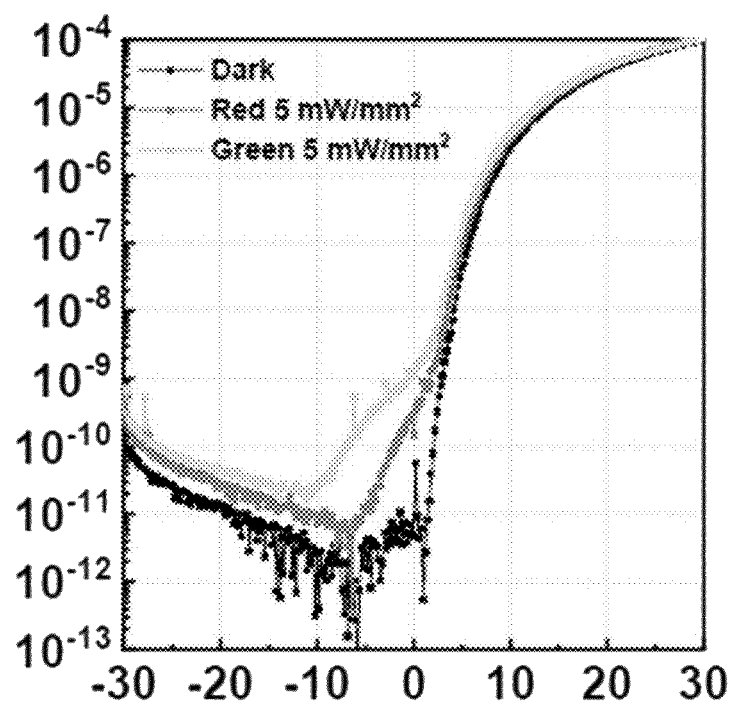
Figure 5C:
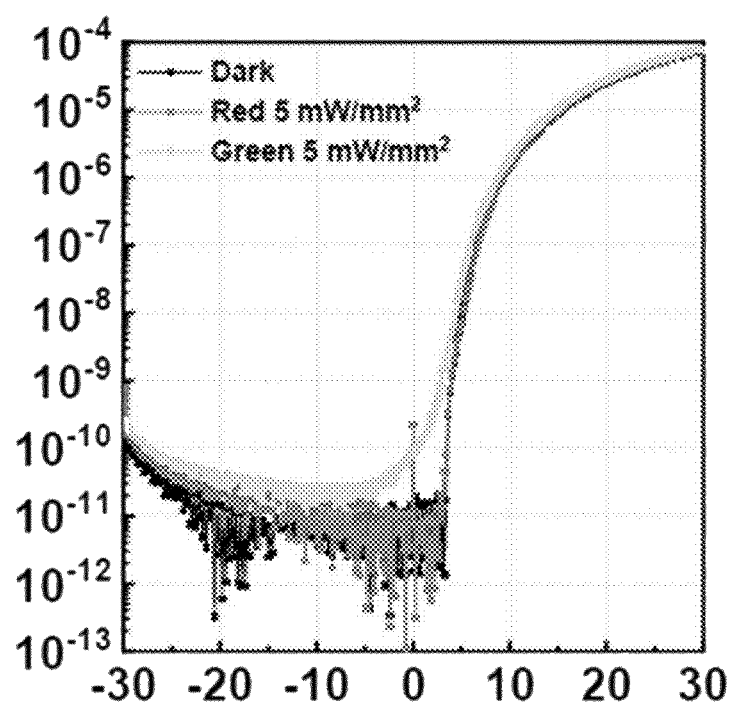

FIGS. 5A to 5C are views illustrating an annealing condition for generating the photocatalyst layer.

FIG. 5A illustrates a result obtained by performing an annealing process at 200 degrees, FIG. 5B illustrates a result obtained by performing an annealing process at 300 degrees, and FIG. 5C illustrates a result obtained by performing an annealing process at 400 degrees. The x axis of the graphs represents a gate voltage "V" and the y axis commonly represents a drain current "A".

When the photocatalyst layer 600 is normally generated, the electrons of the oxide semiconductor thin film 300 travel to the photocatalyst layer 600 due to the photocatalyst layer 600 having positive charges, and thus off-currents are generated even in an off area, in which no voltage is applied to the transistor. That is, an annealing condition for forming a normal photocatalyst layer 600 according to whether currents flow in the off area may be recognized.

It may be identified that no off-current is generated in both red light and green light in the off area (in a range, in which the gate voltage is lower than 0) of FIG. 5A. Accordingly, when the annealing process is performed at 200 degrees, the photocatalyst layer 600 may not be normally formed.

It may be identified that no off-current is generated in both red light and green light in the off area of FIG. 5C, as in FIG. 5A. Accordingly, when the annealing process is performed at 400 degrees, the photocatalyst layer 600 may not be normally formed.

Meanwhile, it may be identified that off-currents are generated in both of red light and green light in the off area of FIG. 5B. That is, it may be identified that currents gradually increase even in the off area due to the normal travel of the electrons of the photocatalyst layer 600. Accordingly, it may be identified that the temperature condition for the annealing is preferably 300 degrees. Accordingly, it may be preferable that the annealing is performed for 10 minutes at 300 degrees in calculations to adjust a proper oxidation condition according to a concentration (e.g., 15%) of the oxidizer.

Figure 6A:
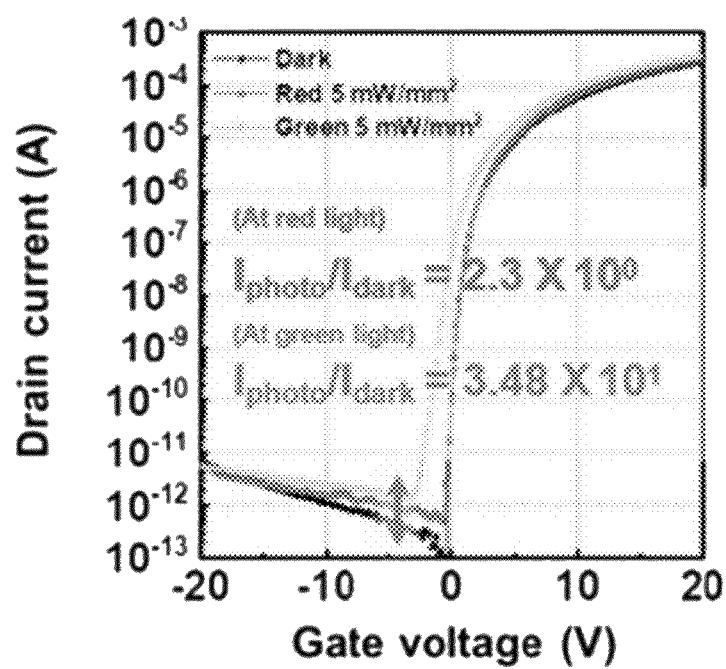
Figure 6B:
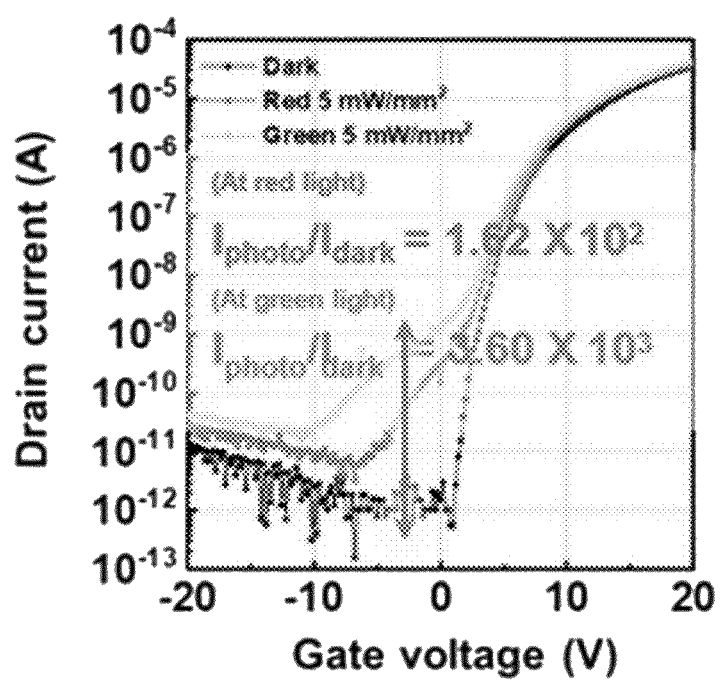

FIGS. 6A to 6C are views illustrating a performance of the oxide thin film transistor including the photocatalyst layer.

FIG. 6A is a graph depicting a result of a conventional oxide thin film transistor that includes no photocatalyst layer, FIG. 6B is a graph depicting a result of an oxide thin film transistor that includes a photocatalyst layer according to the present disclosure, and FIG. 6C is a table representing results of photosensitivities and a detectivities of the oxide thin film transistors of FIGS. 6A and 6B according to colors of the light.

Referring to FIG. 6A, it may be seen that currents decrease in an off area of the conventional oxide thin film transistor that includes no photocatalyst layer. Meanwhile, referring to FIG. 6B, it may be seen that currents increase as off-currents are generated because of the travel of the electrons due to the photocatalyst layer having positive charges in the off area. Accordingly, the oxide thin film transistor may sense a visual ray in spite of a wide band gap of the oxide semiconductor thin film due to the photocatalyst layer.

Referring to FIG. 6C, it may be seen that the oxide thin film transistor including the photocatalyst layer according to the present disclosure has a red light sensitivity of $6.75\times107$, whereas the conventional oxide thin film transistor has a red light sensitivity of 2.30. Furthermore, it may be seen that the transistor according to the present disclosure has a better result even in detectivity as compared with the conventional technology.

Furthermore, it may be seen that the oxide thin film transistor including the photocatalyst layer according to the present disclosure has a green light sensitivity of $3.60\times103$, whereas the conventional oxide thin film transistor has a red light sensitivity of $3.48\times10$. Furthermore, it may be seen that the transistor according to the present disclosure has a better result even in detectivity as compared with the conventional technology.

Accordingly, a problem, in which it is difficult to detect a visual ray due to a wide band gap of the oxide semiconductor thin film 300 may be solved by the photocatalyst layer 600 according to the present disclosure.

Figure 7A:
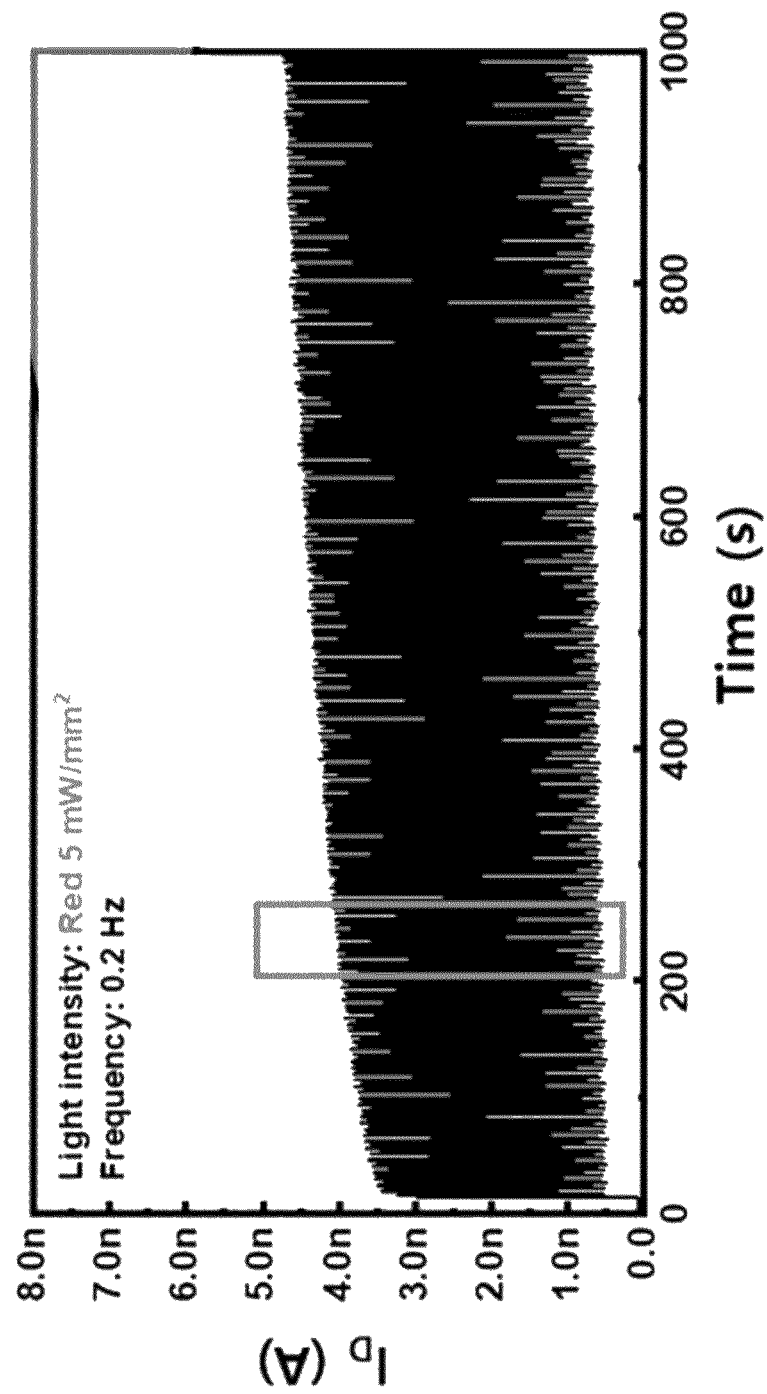
FIGS. 7A and 7B are views illustrating a simulation graph for evaluating an endurance of an oxide film transistor including a photocatalyst layer.
Figure 7B:
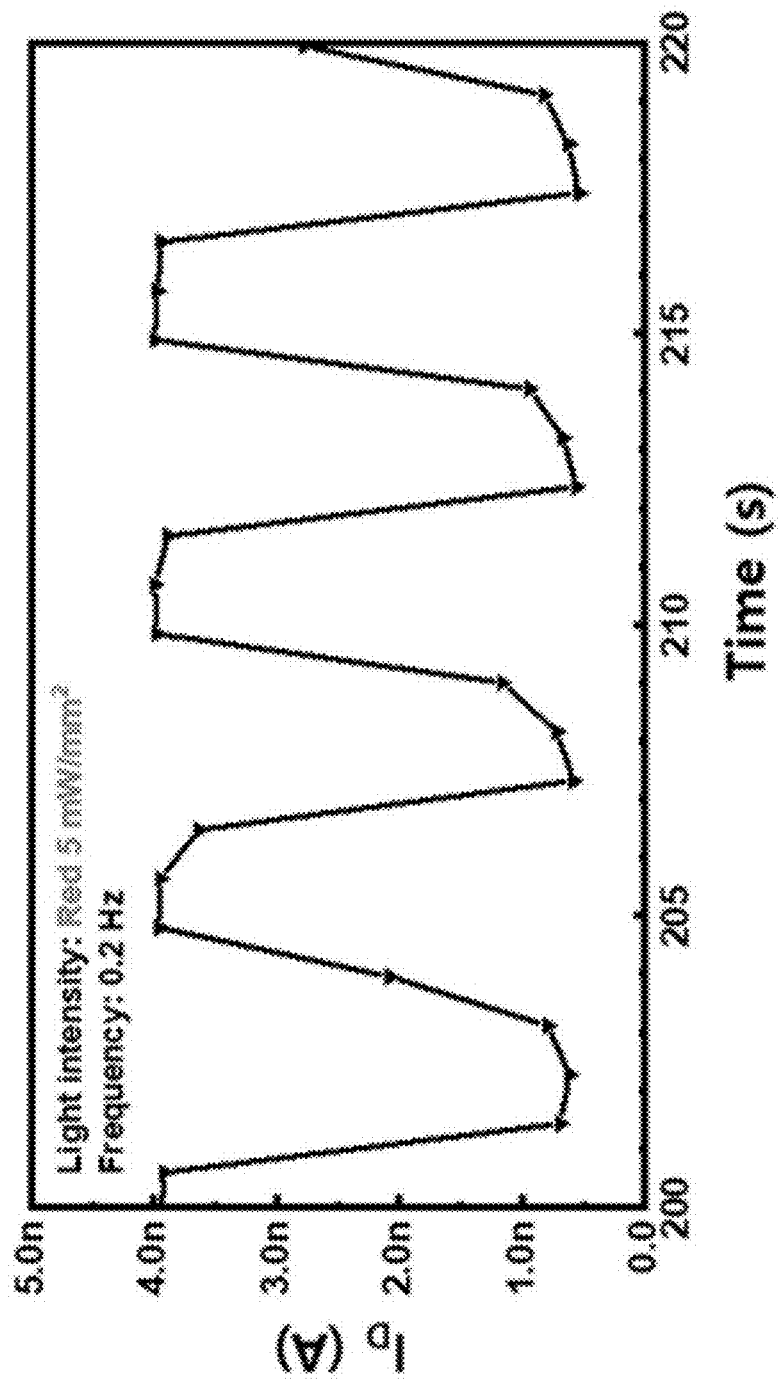

FIGS. 7A and 7B are views illustrating a simulation graph for evaluating an endurance of the oxide film transistor including the photocatalyst layer.

FIG. 7A is a graph depicting a result obtained by performing an endurance test of 1000 seconds, and FIG. 7B is a graph obtained by enlarging the graph of FIG. 7A.

Referring to FIGS. 7A and 7B, when a performance graph of a transistor for 1000 seconds is acquired and is analyzed, it may be seen that the minimum and maximum points of the drain currents are maintained almost constant. That is, it may be seen that the endurance (reliability or durability) of the transistor of the present disclosure is superior to that of the oxide phototransistor, which generally exhibits a high persistent photocurrent (PPC).

The method according to the embodiment may be implemented in the form of a program instruction that may be performed through various computer means, and may be recorded in a computer readable medium. The computer readable medium may include a program instruction, a data file, and a data structure alone or in combination thereof. The program instruction recorded in the medium may be designed or configured particularly for the embodiment or may be a usable one known to those skilled in computer software. An example of the computer readable recording medium may include magnetic media such as a hard disk, a floppy disk, and a magnetic tape, optical recording media such as a CD-ROM and a DVD, magneto-optical media such as a floptical disk, and hardware devices that are particularly configured to store and perform a program instruction, such as a ROM, a RAM, and a flash memory. Further, an example of the program instruction may include high-level language codes which may be executed by a computer using an interpreter as well as machine languages created by using a compiler. The above-mentioned hardware device may be configured to be operated as one or more software module to perform operations of various embodiments, and the converse is applied.

According to an embodiment of the present disclosure, the oxide thin film transistor including the photocatalyst layer for sensing a visual ray may be provided.

Although the embodiments of the present disclosure have been described with reference to the limited embodiments and the drawings, the present disclosure may be variously corrected and modified from the above description by those skilled in the art to which the present disclosure pertains. For example, the above-described technologies can achieve a suitable result even though they are performed in different sequences from those of the above-mentioned method and/or coupled or combined in different forms from the method in which the constituent components such as the system, the architecture, the device, or the circuit are described, or replaced or substituted by other constituent components or equivalents.

Therefore, the other implementations, other embodiments, and the equivalents of the claims pertain to the scope of the claims.

What is claimed is:

1. A method for manufacturing an oxide thin film transistor, the method comprising:
    forming a gate electrode on a substrate;
    forming an insulating layer on the gate electrode;
    forming an oxide semiconductor thin film on the insulating layer through a first sputtering process by using a first mask;
    forming an electrode on the oxide semiconductor thin film through a second sputtering process by using the first mask used for forming the oxide semiconductor thin film;
    applying an oxidizer to an area of the electrode; and
    annealing the area of the electrode, to which the oxidizer is applied.

2. The method of claim 1, wherein the annealed area of the electrode is a photocatalyst layer for moving electrons of the oxide semiconductor thin film.

3. The method of claim 2, wherein the electrode becomes a first electrode and a second electrode divided by the photocatalyst layer, and
    wherein the first electrode is a source electrode and the second electrode is a drain electrode.

4. The method of claim 2, wherein the photocatalyst layer has positive charges.

5. The method of claim 1, wherein the annealing is performed at 300 degrees.

6. The method of claim 1, wherein the annealing is performed for 10 minutes.

7. The method of claim 1, wherein the oxide semiconductor thin film includes at least one of indium gallium zinc oxide (IGZO), zinc oxide (ZnO), indium zinc oxide (IZO), indium tin oxide (ITO), zinc tin oxide (ZTO), silicon indium zinc oxide (SIZO), gallium zinc oxide (GZO), hafnium indium zinc oxide (HIZO), zinc indium tin oxide (ZITO), and aluminum zinc tin oxide (AZTO).

8. The method of claim 2, wherein the photocatalyst layer includes at least one of titanium dioxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$).

9. The method of claim 2, wherein the photocatalyst layer generates off-currents.

10. The method of claim 1, wherein the electrode includes tungsten (W).

11. The method of claim 10, wherein the annealed area of the electrode includes tungsten trioxide ($WO_3$).

12. The method of claim 1, wherein the gate electrode includes a p+-Si material.

13. The method of claim 1, wherein the insulating layer includes a polyvinyl alcohol (PVA), polyvinylpyrrolidone (PVP), or polymethyl methacrylate (PMMA) material.

* * * * *